(12) United States Patent
Xie et al.

(10) Patent No.: US 10,446,399 B2
(45) Date of Patent: Oct. 15, 2019

(54) HARD MASK LAYER TO REDUCE LOSS OF ISOLATION MATERIAL DURING DUMMY GATE REMOVAL

(71) Applicant: GLOBALFOUNDRIES Inc., Grand Cayman (KY)

(72) Inventors: Ruilong Xie, Schenectady, NY (US); Min Gyu Sung, Latham, NY (US); Chanro Park, Clifton Park, NY (US); Hoon Kim, Horseheads, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 162 days.

(21) Appl. No.: 15/339,497

(22) Filed: Oct. 31, 2016

(65) Prior Publication Data

US 2018/0122644 A1    May 3, 2018

(51) Int. Cl.
| | | |
|---|---|---|
| *H01L 21/28* | (2006.01) | |
| *H01L 29/66* | (2006.01) | |
| *H01L 27/088* | (2006.01) | |
| *H01L 21/768* | (2006.01) | |

(Continued)

(52) U.S. Cl.
CPC .. *H01L 21/28141* (2013.01); *H01L 21/76802* (2013.01); *H01L 21/76877* (2013.01); *H01L 27/088* (2013.01); *H01L 29/66545* (2013.01); *H01L 29/66606* (2013.01); *H01L 29/66621* (2013.01); *H01L 29/66871* (2013.01); *H01L 21/31144* (2013.01); *H01L 21/823437* (2013.01); *Y02P 80/30* (2015.11)

(58) Field of Classification Search
CPC ......... H01L 21/28141; H01L 21/76877; H01L 29/66545; H01L 27/088; H01L 21/76802; H01L 21/823437; H01L 29/66606; H01L 29/66871; H01L 21/31144; H01L 29/6653; H01L 29/66689
See application file for complete search history.

(56) References Cited

U.S. PATENT DOCUMENTS

| | | | |
|---|---|---|---|
| 9,263,252 B2* | 2/2016 | Chang | ............... H01L 29/66545 |
| 2015/0187594 A1* | 7/2015 | Tu | ..................... H01L 21/31055 |
| | | | 257/392 |

(Continued)

*Primary Examiner* — William F Kraig
*Assistant Examiner* — Khatib A Rahman
(74) *Attorney, Agent, or Firm* — Thompson Hine LLP; Francois Pagette

(57) ABSTRACT

A method includes providing a starting semiconductor structure, the starting semiconductor structure including a semiconductor substrate with active region(s) separated by isolation regions, the active region(s) including source/drain regions of epitaxial semiconductor material, dummy gate structures adjacent each source/drain region, the dummy gate structures including dummy gate electrodes with spacers adjacent opposite sidewalls thereof and gate caps thereover, and openings between the dummy gate structures. The method further includes filling the openings with a dielectric material, recessing the dielectric material, resulting in a filled and recessed structure, and forming a hard mask liner layer over the filled and recessed structure to protect against loss of the recessed dielectric material during subsequent removal of unwanted dummy gate electrodes. A resulting semiconductor structure formed by the method is also provided.

12 Claims, 10 Drawing Sheets

(51) Int. Cl.
*H01L 21/8234* (2006.01)
*H01L 21/311* (2006.01)

(56) References Cited

U.S. PATENT DOCUMENTS

2016/0365426 A1* 12/2016 Ching ................. H01L 29/6656
2016/0372470 A1* 12/2016 Ok ................. H01L 21/823828

* cited by examiner

HARD MASK LAYER TO REDUCE LOSS OF ISOLATION MATERIAL DURING DUMMY GATE REMOVAL

BACKGROUND OF THE INVENTION

Technical Field

The present invention generally relates to removal of dummy gate electrodes in a gate-last fabrication flow. More particularly, the present invention relates to isolation material loss during dummy gate electrode removal in a gate-last fabrication flow.

Background Information

In some modern semiconductor fabrication processes, it has been determined to be more efficient to fabricate more device parts than actually needed or wanted, and then remove the unwanted ones, rather than only fabricating the desired ones. For example, in a replacement gate or gate last transistor fabrication process, more dummy gates may initially be fabricated than actually desired. As device size continues to shrink, removal of unwanted portions may also remove some surrounding material to the detriment of yield. For example, removing dummy gate structures may result in the loss of some surrounding isolation material, for example, an inter-layer dielectric.

SUMMARY OF THE INVENTION

Therefore, a need exists to reduce or prevent loss of isolation material while removing unwanted dummy gates during a gate-last fabrication flow.

The shortcomings of the prior art are overcome and additional advantages are provided through the provision, in one aspect, of a method of reducing or eliminating loss of isolation material during removal of unwanted dummy gates. The method comprises providing a starting semiconductor structure, the starting semiconductor structure comprising a semiconductor substrate, one or more active regions over the semiconductor substrate separated by isolation regions, the one or more active regions comprising source/drain regions of epitaxial semiconductor material, dummy gate structures adjacent each source/drain region, the dummy gate structures comprising dummy gate electrodes with spacers adjacent opposite sidewalls thereof and gate caps thereover, and openings between the dummy gate structures. The method further comprises filling the openings with a dielectric material, recessing the dielectric material, resulting in a filled and recessed structure, and forming a hard mask liner layer over the filled and recessed structure, the hard mask liner layer protecting against loss of the recessed dielectric material during subsequent removal of one or more and less than all of the dummy gate electrodes.

In accordance with another aspect, a semiconductor structure is provided. The semiconductor structure comprises a semiconductor substrate, one or more active regions over the semiconductor substrate and separated by isolation regions, the one or more active regions comprising source/drain regions of epitaxial semiconductor material. The semiconductor structure further comprises partial dummy gate structures adjacent each source/drain region, the partial dummy gate structures comprising dummy gate electrodes and spacers adjacent opposite sidewalls thereof, the partial gate structures being separated by recessed dielectric material, resulting in a semiconductor structure, and a hard mask liner layer over the semiconductor structure, the hard mask liner layer protecting against loss of the recessed dielectric material during subsequent removal of one or more and less than all of the dummy gate electrodes.

These, and other objects, features and advantages of this invention will become apparent from the following detailed description of the various aspects of the invention taken in conjunction with the accompanying drawings.

DETAILED DESCRIPTION OF THE INVENTION

Figure 1:
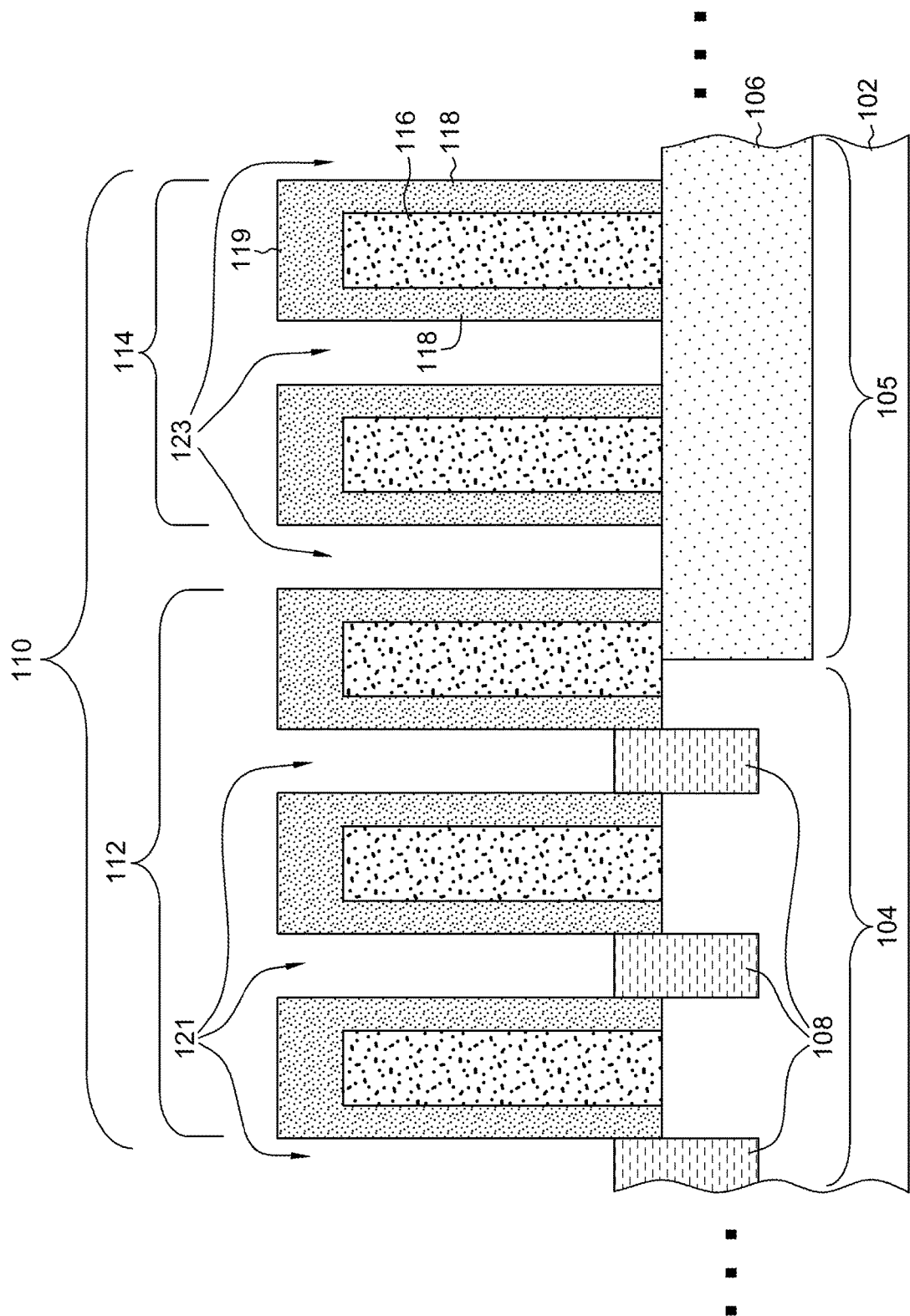
FIG. 1 is a cross-sectional view of one example of a starting semiconductor structure, in accordance with one or more aspects of the present invention. The starting semiconductor structure includes a semiconductor substrate with active regions separated by isolation regions, the active regions including source/drain regions of epitaxial semiconductor material, dummy gate structures, some of the dummy gate structures being situated adjacent the source/drain regions and a remainder of the dummy gate structures being situated above the isolation regions, the dummy gate structures including dummy gate electrodes, spacers at sidewalls of the dummy gate electrodes, and a dummy gate cap, openings above the source/drain regions and openings above the isolation regions.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, in accordance with one or more aspects of the present invention. The starting semiconductor structure includes a semiconductor substrate 102 with active regions (e.g., active region 104) separated by isolation regions (e.g., isolation region 105), the active regions including source/drain regions 108 of epitaxial semiconductor material, dummy gate structures 110, some of the dummy gate structures 112 being situated adjacent the source/drain regions and a remainder of the dummy gate structures 114 being situated above the isolation regions, the dummy gate structures including dummy gate electrodes (e.g., dummy gate electrode 116), spacers (e.g., spacers 118) at sidewalls of the dummy gate electrodes, and a dummy gate cap 119, openings 121 above the source/drain regions and openings 123 above the isolation regions. Optionally, the spacers may also be recessed down to a height of the dielectric material (see, e.g., FIG. 2). In one example, the dielectric material may be recessed with regard to dummy gate electrodes by about 10 nm to about 15 nm.

The starting semiconductor structure may be conventionally fabricated, for example, using known processes and techniques. However, although only a portion is shown for simplicity, it will be understood that, in practice, many such structures are typically included on the same substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof;

an alloy semiconductor including GaAsP, AlInAs, GaInAs, GaInP, or GaInAsP or combinations thereof.

Figure 2:
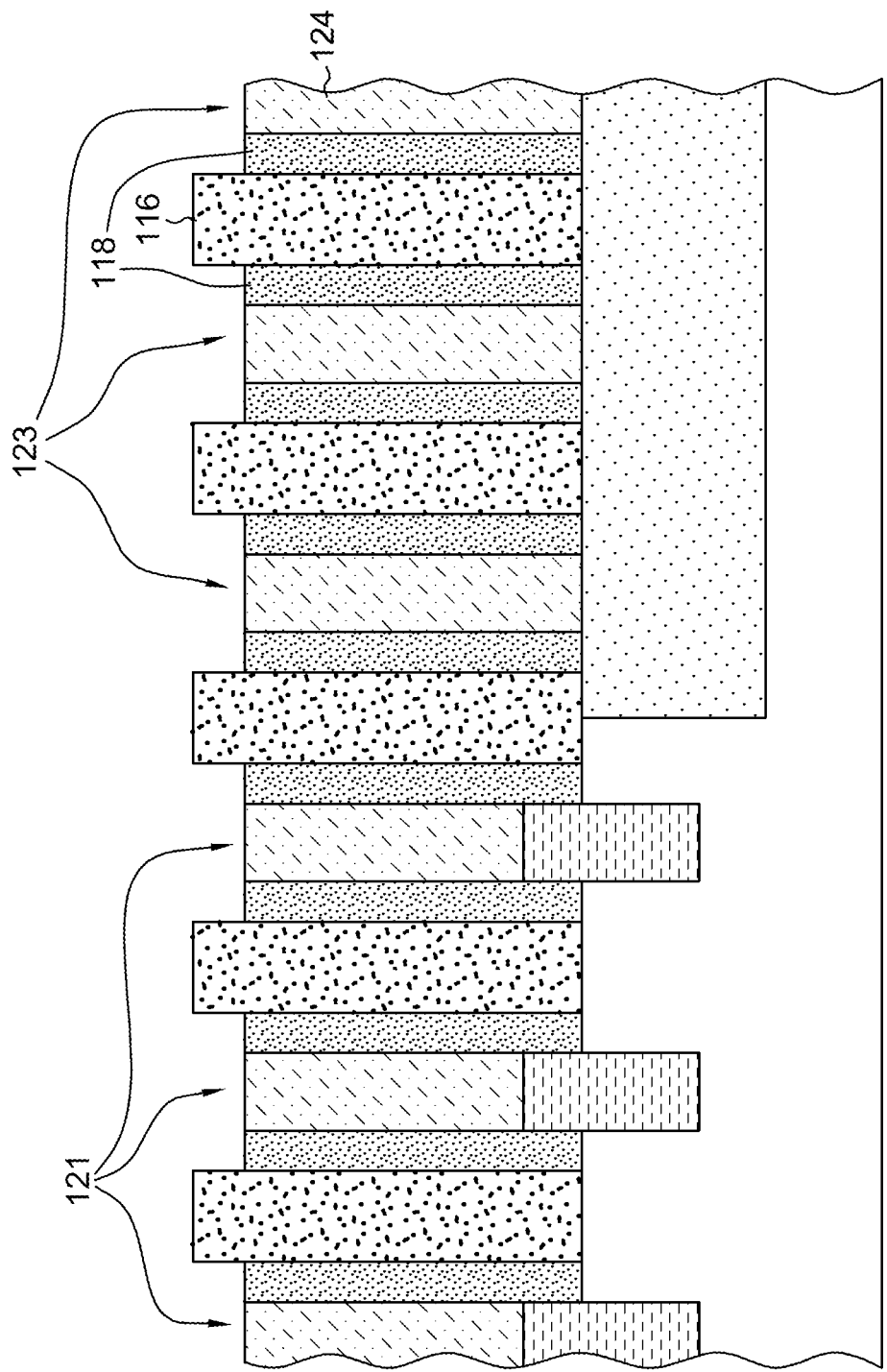
FIG. 2 depicts one example of the structure of FIG. 1 after filling the openings with a dielectric material, planarizing excess dielectric material down to the dummy gate caps, removing the dummy gate caps, planarizing down to the dummy gate electrodes, and recessing the dielectric material below the dummy gate electrodes, matching the top surface of the recessed spacers, in accordance with one or more aspects of the present invention.

FIG. 2 depicts one example of the structure of FIG. 1 after filling openings 121 and 123 with a dielectric material 124, planarizing excess dielectric material down to dummy gate caps 119, removing the dummy gate caps, planarizing down to the dummy gate electrodes 116 (i.e., stopping on the gate electrodes), and recessing the dielectric material below the dummy gate electrodes 116, matching the top surface of the recessed spacers 118, in accordance with one or more aspects of the present invention. Of course, if the spacers were not recessed, the depressions would only extend over the dielectric material.

In one example, the dielectric material is recessed about 10 nm to about 15 nm below the surface of the dummy gate electrodes. In one example, the planarizing may be accomplished using a polishing process, for example, a chemical-mechanical polishing (CMP) process.

Figure 3:
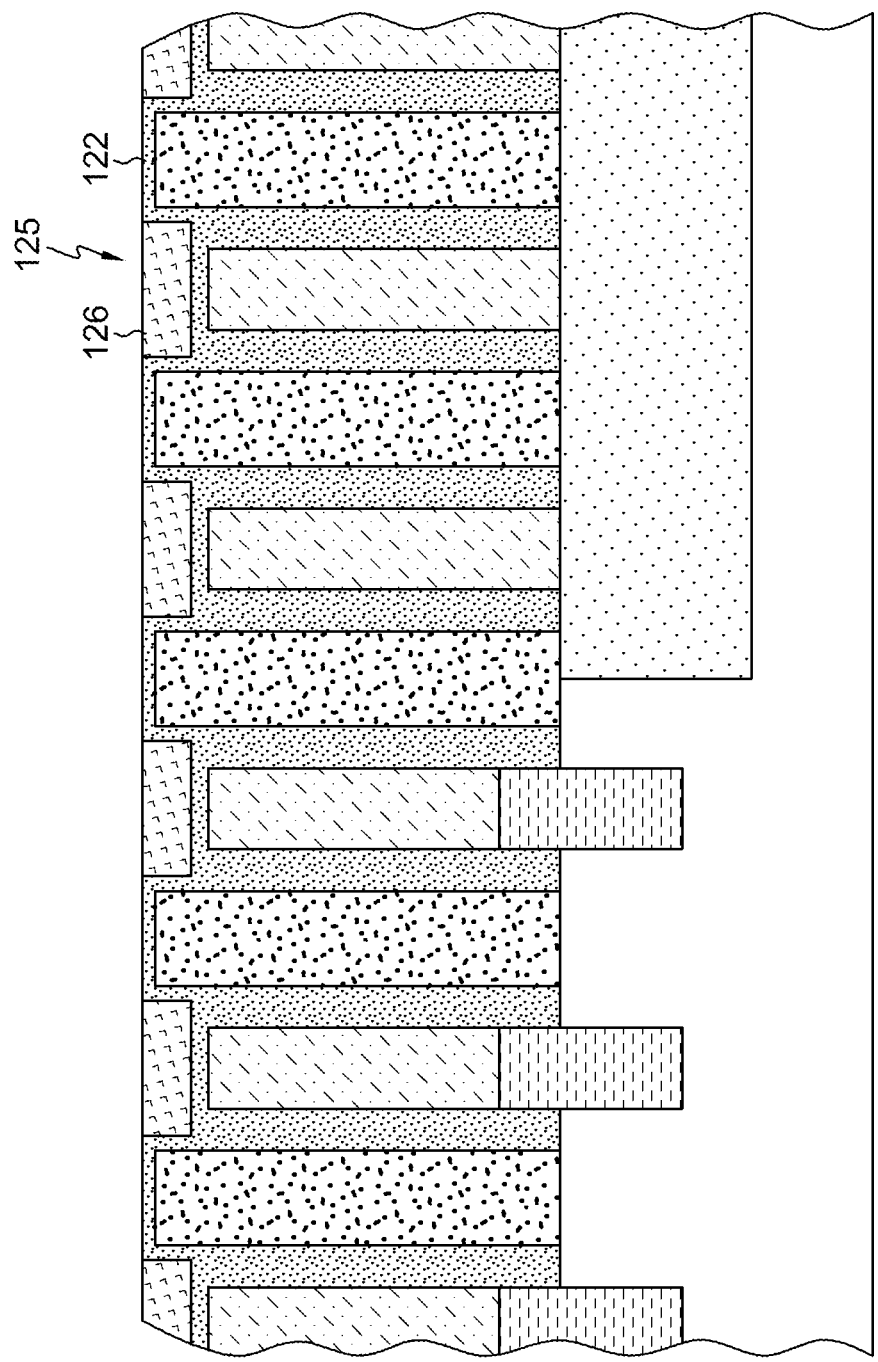
FIG. 3 depicts one example of the structure of FIG. 2 after forming a hard mask liner layer over the structure, resulting in depressions, and filling the depressions with a filler material, resulting in filled depressions, in accordance with one or more aspects of the present invention.

FIG. 3 depicts one example of the structure of FIG. 2 after forming a hard mask liner layer 122 over the structure, resulting in depressions 125, filling the depressions with a filler material 126 (e.g., oxide Inter Layer Dielectric (ILD), resulting in filled depressions. In one example, the depressions may be over filled with the filler material, then planarized (e.g., CMP) down to the hard mask liner layer.

Figure 4:
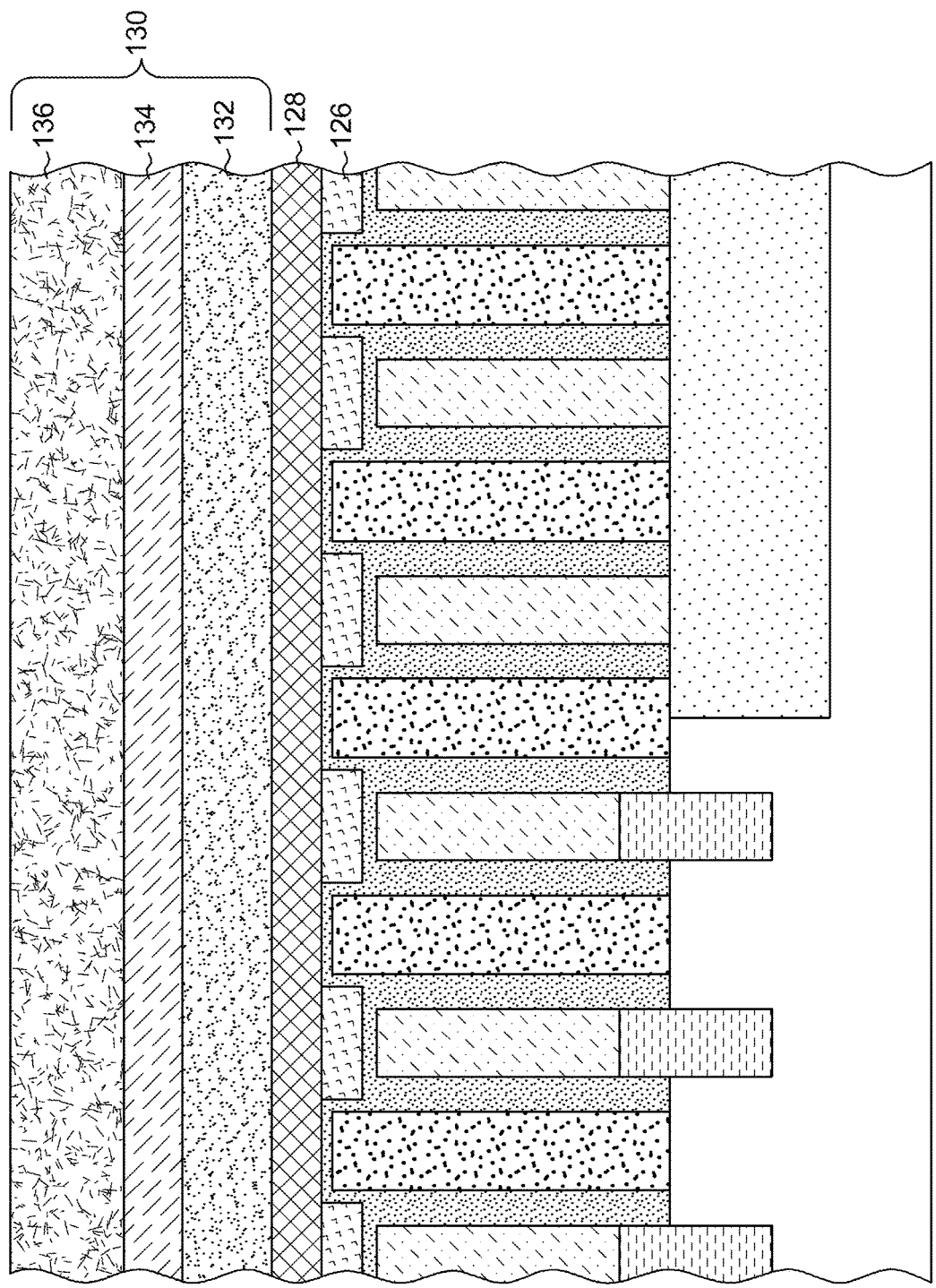
FIG. 4 depicts one example of the structure of FIG. 3 after forming an inter-layer dielectric (ILD) layer (e.g., a thin amorphous Si layer) to protect the structure with filled depressions, and forming a lithographic stack over the dielectric layer, the lithographic stack including, for example, a tri-layer stack including a bottom organic planarization layer (OPL), a middle dielectric layer (e.g., low-temperature oxide or silicon-containing anti-reflective coating (SiARC)) and a top lithographic blocking layer (e.g., photo resist), in accordance with one or more aspects of the present invention.

FIG. 4 depicts one example of the structure of FIG. 3 after forming an inter-layer dielectric (ILD) layer 128 (e.g., a thin amorphous Si layer) to protect the structure with filled depressions, and forming a lithographic stack 130 over the dielectric layer, the lithographic stack including, for example, a tri-layer stack including a bottom organic planarization layer (OPL) 132, a middle dielectric layer 134 (e.g., low-temperature oxide or silicon-containing anti-reflective coating (SiARC)) and a top lithographic blocking layer 136 (e.g., photo resist), in accordance with one or more aspects of the present invention.

Figure 5:
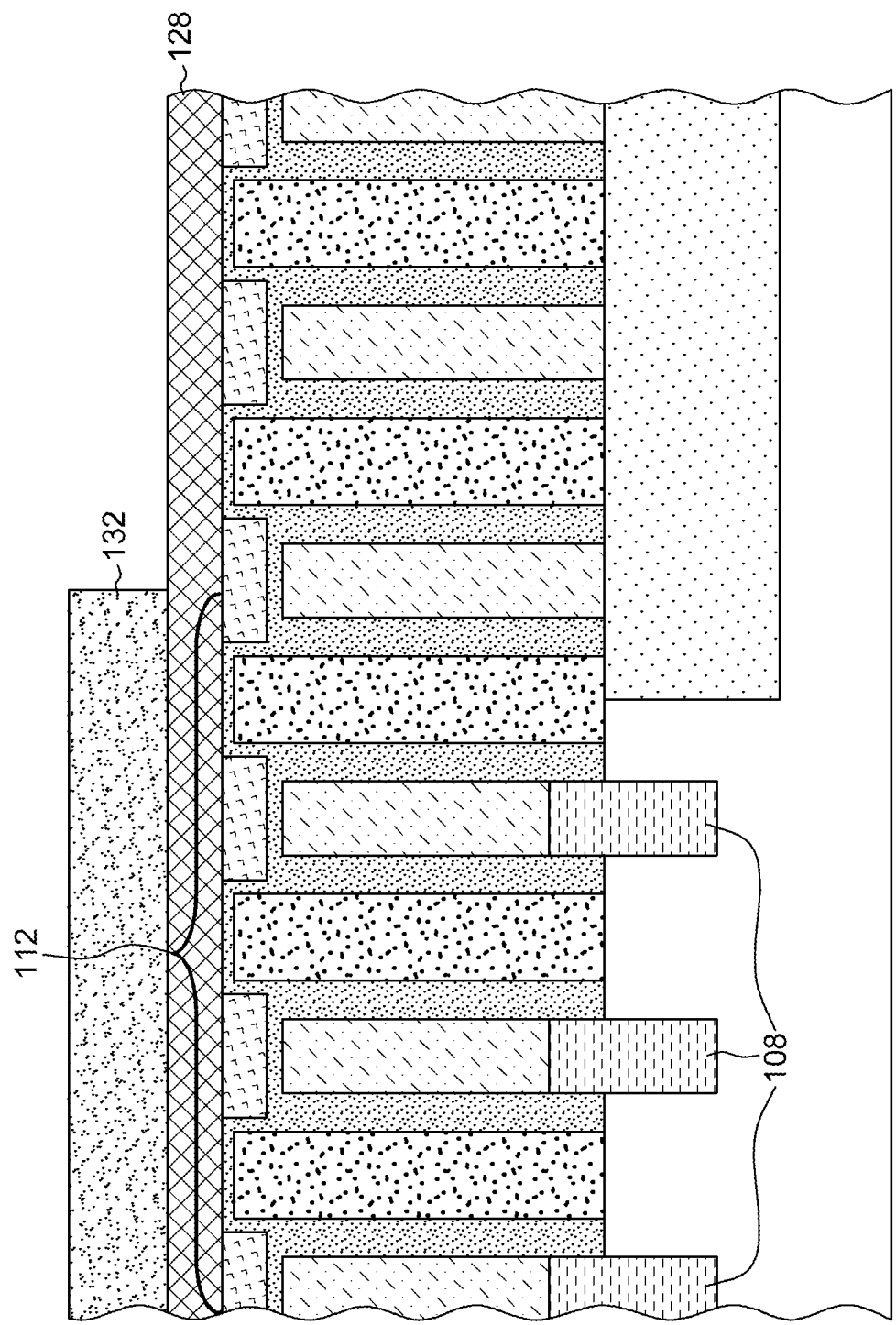
FIG. 5 depicts one example of the structure of FIG. 4 after patterning, lithography and removal of remaining material of the top lithographic blocking layer and the middle dielectric layer, leaving the ILD layer and partial OPL over the partial gate structures over the active areas, in accordance with one or more aspects of the present invention. The inclusion of the ILD layer protects against damage during removal of the middle dielectric layer.

FIG. 5 depicts one example of the structure of FIG. 4 after patterning, lithography and removal of remaining material of top lithographic blocking layer 136 and middle dielectric layer 134, leaving ILD layer 128 and partial OPL 132 over partial gate structures 112 over the active areas 104, in accordance with one or more aspects of the present invention. The inclusion of ILD layer 128 protects against damage during removal of layer 134.

Figure 6:
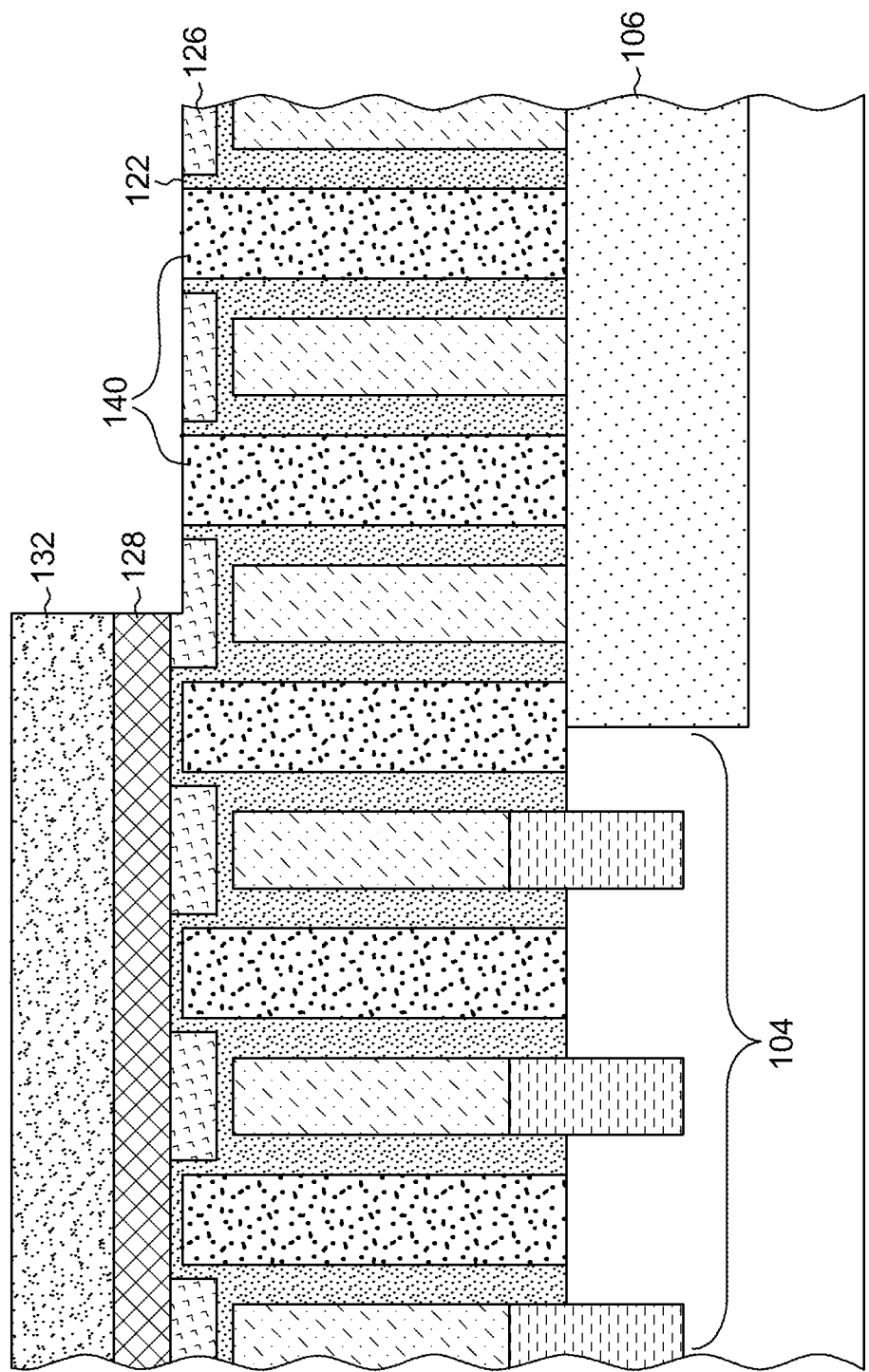
FIG. 6 depicts one example of the structure of FIG. 5 after removing a portion of the ILD layer and portions of the hard mask liner layer, exposing the dummy gate electrodes and the filler material situated above the isolation regions after which a cleaning process is used, in accordance with one or more aspects of the present invention.

FIG. 6 depicts one example of the structure of FIG. 5 after removing a portion of ILD layer 128 and portions of hard mask liner layer 122, exposing the dummy gate electrodes 140 and filler material 126 situated above the isolation regions 106, in accordance with one or more aspects of the present invention. Note that removal of the hard mask liner layer portions may, in some cases, result in negligible loss of the filler material below the hard mask liner layer portions.

Figure 7:
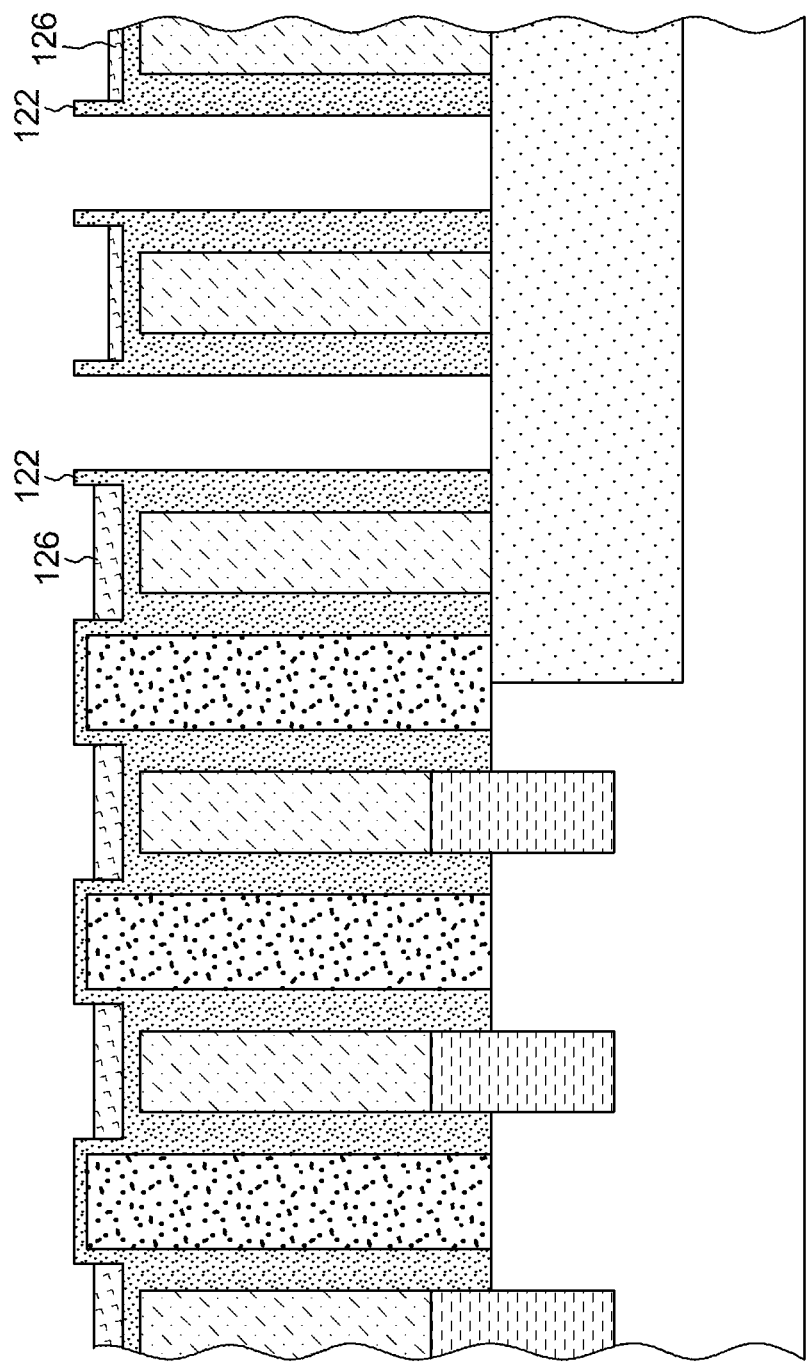
FIG. 7 depicts one example of the structure of FIG. 6 after removal of the OPL layer, then concurrent removal of the dummy gates and partial ILD layer, for example, using an etching process, in accordance with one or more aspects of the present invention.

FIG. 7 depicts one example of the structure of FIG. 6 after removal of OPL layer 132, then concurrent removal of dummy gates 140 and partial ILD layer 128, for example, using an etching process, in accordance with one or more aspects of the present invention. At this point, a cleaning is done using, for example, a post-etch wet cleaning process that includes the use of, for example, a DHF contained process.

Figure 8:
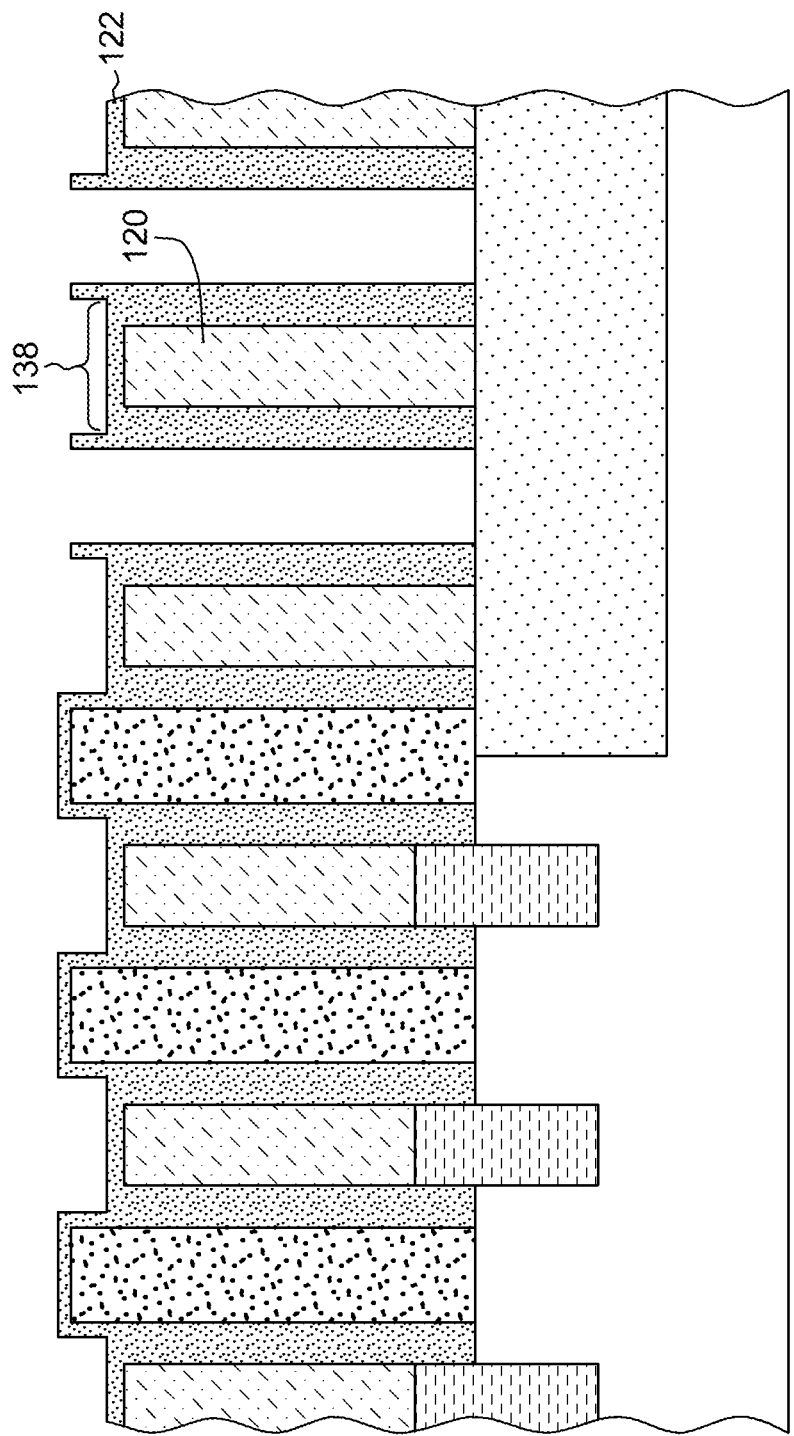
FIG. 8 depicts one example of the structure of FIG. 7 after removal of the remaining filler material from the filled depressions, such that, during a remainder of the replacement gate process (e.g., see FIGS. 9 and 10), the remaining portions of the hard mask liner layer prevent loss of the dielectric material from this point forward in fabrication, in accordance with one or more aspects of the present invention.

FIG. 8 depicts one example of the structure of FIG. 7 after removal of remaining filler material 126 from the filled depressions, such that, during a remainder of the replacement gate process (e.g., see FIGS. 9 and 10), the remaining portions of hard mask liner layer 122 prevent loss of dielectric material 120 from this point forward in fabrication, in accordance with one or more aspects of the present invention.

Figure 9:
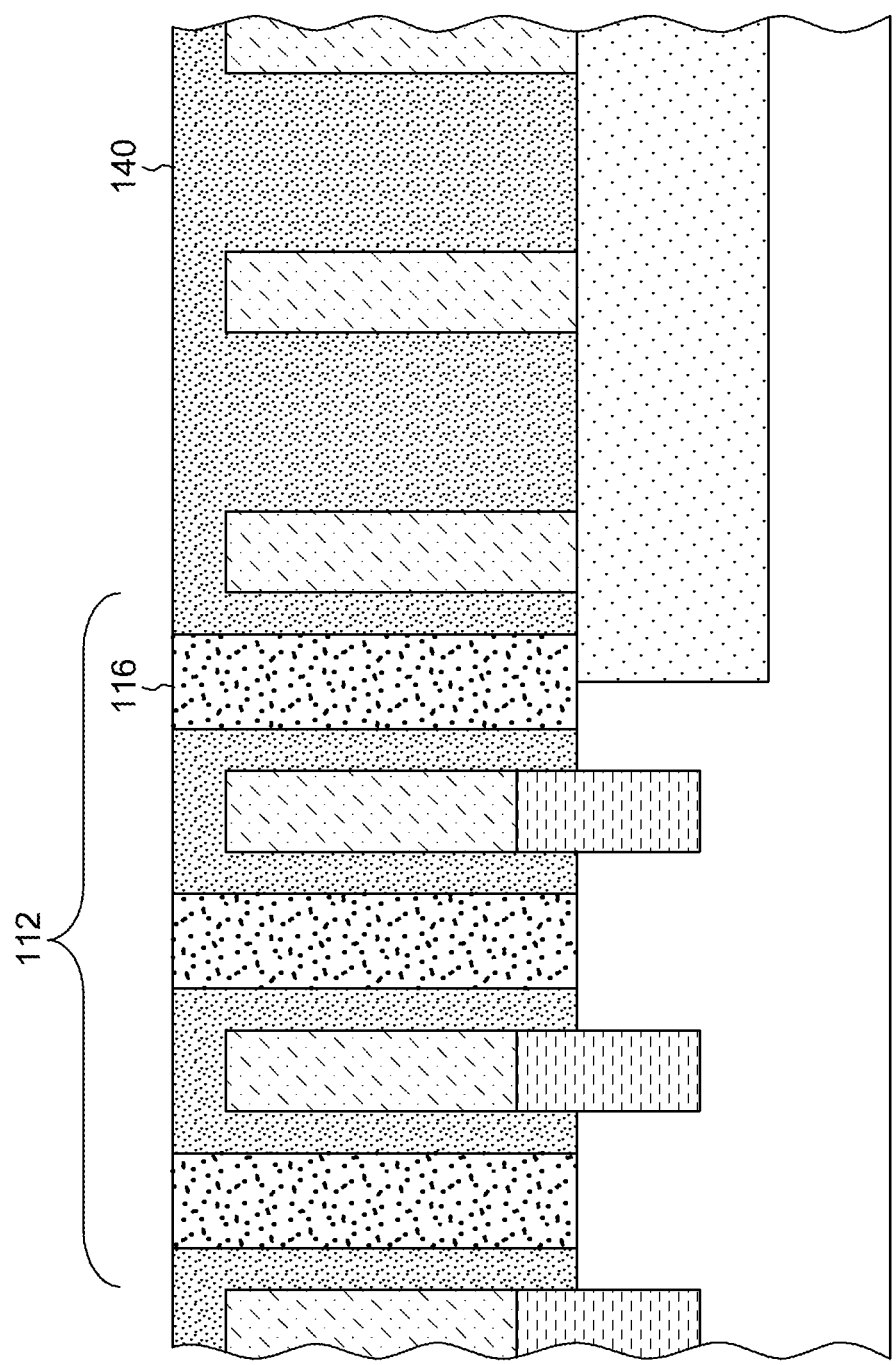
FIG. 9 depicts one example of the structure of FIG. 8 after blanket formation and planarization of the material of the hard mask liner layer down to the dummy gate electrodes of the dummy gate structures, in accordance with one or more aspects of the present invention.

FIG. 9 depicts one example of the structure of FIG. 8 after blanket formation and planarization of the material 140 of hard mask liner layer 122 down to dummy gate electrodes 116 of dummy gate structures 112, in accordance with one or more aspects of the present invention.

Figure 10:
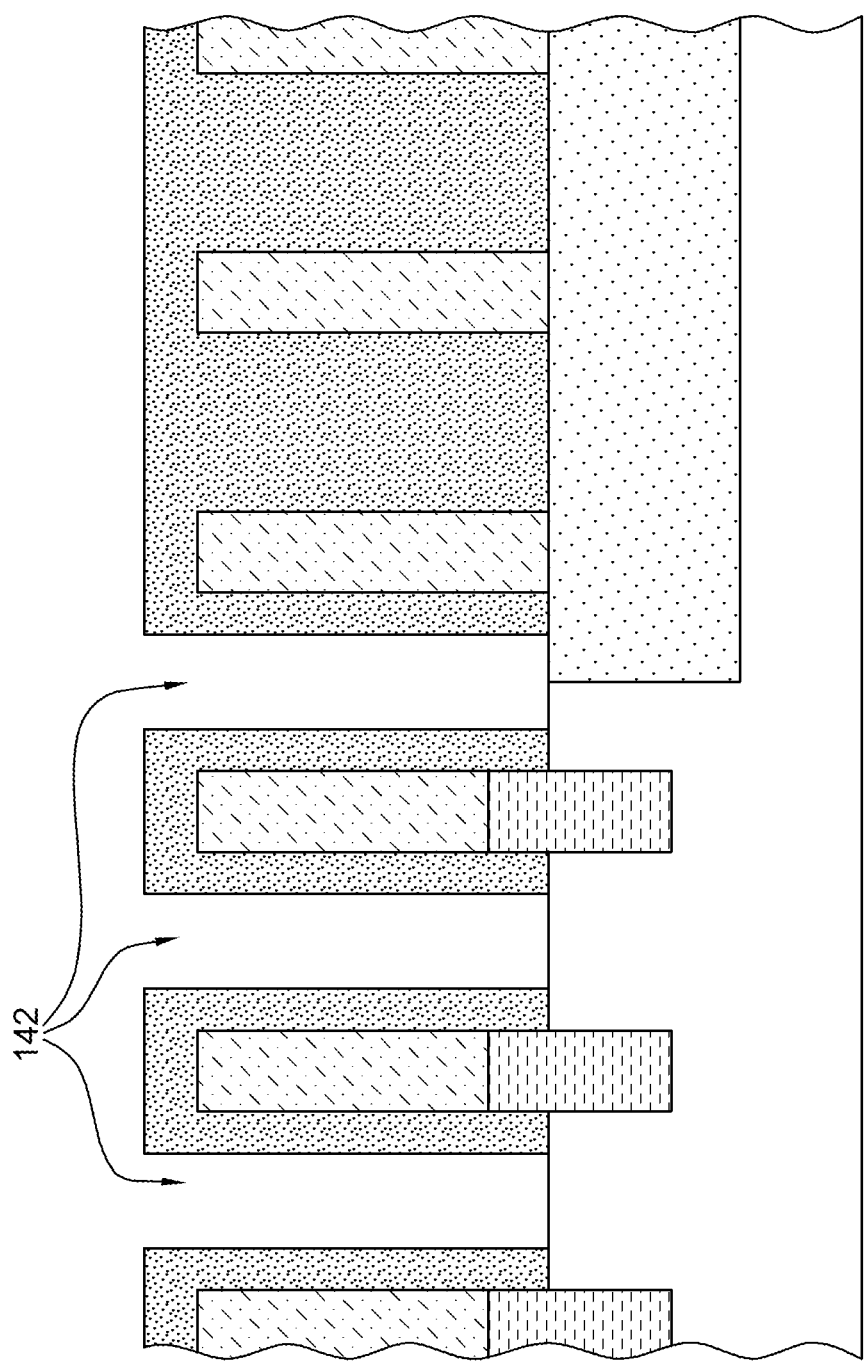
FIG. 10 depicts one example of the structure of FIG. 9 after removing the dummy gate electrodes of the dummy gate structures, leaving gate openings, in accordance with one or more aspects of the present invention, after which conductive gate electrodes can be formed and fabrication can continue.

FIG. 10 depicts one example of the structure of FIG. 9 after removing dummy gate electrodes 116 of dummy gate structures 112, leaving gate openings 142, in accordance with one or more aspects of the present invention, after which conductive gate electrodes can be formed and fabrication can continue.

Note that during the dummy gate and dummy oxide removal process, usually a DHF contained wet clean process is needed, and without layer 140 and layer 126's (see FIG. 5) protection for ILD oxide 124, the cleaning process could easily lead to ILD oxide 124 damage during the process.

In a first aspect, disclosed above is a method. The method includes providing a starting semiconductor structure, the starting semiconductor structure including a semiconductor substrate, active region(s) over the semiconductor substrate separated by isolation regions, the active region(s) including source/drain regions of epitaxial semiconductor material, dummy gate structures adjacent each source/drain region, the dummy gate structures including dummy gate electrodes with spacers adjacent opposite sidewalls thereof and gate caps thereover, and openings between the dummy gate structures. The method further includes filling the openings with a dielectric material, recessing the dielectric material, resulting in a filled and recessed structure and forming a hard mask liner layer over the filled and recessed structure, the hard mask liner layer protecting against loss of the recessed dielectric material during subsequent removal of one or more and less than all of the dummy gate electrodes.

In one example, the method may further include, for example, prior to forming the hard mask liner layer, recessing the spacers to a height of the recessed dielectric material.

In one example, forming the hard mask liner layer in the method of the first aspect may result, for example, in depressions above the recessed dielectric material, and the method may further include, for example, filling the depressions with a filler material, resulting in filled depressions, forming an inter-layer dielectric (ILD) protecting layer above the hard mask liner layer over the active region(s), forming a lithographic patterning stack over the ILD protecting layer, the lithographic patterning stack including an anti-reflective coating (ARC) material layer and an organic planarizing layer (OPL), patterning and removing portions of the lithographic patterning stack over the ILD protecting layer, and removing the ARC material layer selective to the ILD protecting layer such that ILD loss is prevented. In one example, the method may further include, for example, removing portions of the ILD protecting layer over the dummy gate electrodes situated above the isolation regions, resulting in exposed dummy gate electrodes, removing the OPL layer, the exposed dummy gate electrodes, and a remainder of the ILD protecting layer, and removing the filler material from the filled depressions. In one example, the method may further include, for example, forming a blanket hard mask layer over the structure after removing the filler material from the filled depressions, planarizing the blanket hard mask layer down to and stopping on remaining dummy gate electrodes situated at least partially over the active region(s), resulting in exposed remaining dummy gate electrodes and removing the remaining dummy gate electrodes. In one example, the method may further include, after the removing, continuing with fabrication of a desired semiconductor device.

In one example, forming the ILD protecting layer and the lithographic patterning stack may include, for example, forming a ILD protecting layer over the hard mask liner layer and filled depressions, and forming a lithographic patterning stack over the ILD protecting layer, the lithographic stack including a bottom organic planarization layer, an ARC material layer, and a top lithographic blocking layer. In one example, the lithographic stack may further include, for example, a top lithographic blocking layer, the method further including patterning the lithographic blocking layer for removal of a remainder the lithographic stack over the gate structures above the isolation regions, removing remaining layers of the lithographic stack except the organic planarization layer, and removing the dielectric layer over the gate structures situated above the isolation regions.

In a second aspect, disclosed above is a semiconductor structure. The semiconductor structure includes a semiconductor substrate, active region(s) over the semiconductor substrate and separated by isolation regions, the active region(s) including source/drain regions of epitaxial semiconductor material. The semiconductor structure further includes partial dummy gate structures adjacent each source/drain region, the partial dummy gate structures including dummy gate electrodes and spacers at opposite sidewalls thereof, the partial dummy gate structures being separated by recessed dielectric material, resulting in a semiconductor structure, and a hard mask liner layer over the semiconductor structure, the hard mask liner layer protecting against loss of the recessed dielectric material during subsequent removal of less than all of the dummy gate electrode(s).

In one example, the recessed dielectric material may be, for example, recessed to about 10 nm to about 15 nm below top surfaces of the partial dummy gate structures.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method comprising:
providing a starting semiconductor structure, the starting semiconductor structure comprising a semiconductor substrate, one or more active regions over the semiconductor substrate separated by isolation regions, the one or more active regions including dummy gate structures and openings between the dummy gate structures, the dummy gate structures including dummy gate electrodes and spacers adjacent opposite sidewalls of the dummy gate electrodes;
filling the openings with a dielectric material;
recessing the dielectric material in the openings relative to the spacers to define depressions between the spacers;
recessing the spacers relative to the dummy gate structures to widen the depressions;
after recessing the spacers, forming a hard mask liner layer within the depressions over the dielectric material and the spacers; and
after forming the hard mask liner layer within the depressions, filling the depressions over the hard mask liner layer with a filler material to define filled depressions.

2. The method of claim 1, further comprising:
forming an inter-layer dielectric (ILD) protecting layer above the hard mask liner layer over the one or more active regions;
forming a lithographic patterning stack over the ILD protecting layer, wherein the lithographic patterning stack comprises an anti-reflective coating (ARC) material layer and an organic planarization layer (OPL) layer;
patterning and removing portions of the lithographic patterning stack over the ILD protecting layer; and
removing the ARC material layer selective to the ILD protecting layer such that ILD loss is prevented.

3. The method of claim 2, further comprising:
removing portions of the ILD protecting layer over the dummy gate electrodes situated above the isolation regions, resulting in exposed dummy gate electrodes;
removing the OPL layer, the exposed dummy gate electrodes, and a remainder of the ILD protecting layer; and
removing the filler material from the filled depressions.

4. The method of claim 3, further comprising:
forming a blanket hard mask layer over the structure after removing the filler material from the filled depressions;
planarizing the blanket hard mask layer down to remaining dummy gate electrodes situated at least partially over the one or more active regions, resulting in exposed remaining dummy gate electrodes; and
removing the exposed remaining dummy gate electrodes.

5. The method of claim 4, further comprising, after the removing, continuing with fabrication of a desired semiconductor device.

6. The method of claim 3, wherein forming the ILD protecting layer and the lithographic patterning stack comprises:
forming the ILD protecting layer over the hard mask liner layer and filled depressions; and
forming the lithographic patterning stack over the ILD protecting layer, the lithographic stack comprising a bottom OPL layer, an ARC material layer, and a top lithographic blocking layer.

7. The method of claim 6, wherein the lithographic stack further comprises a top lithographic blocking layer, the method further comprising:
patterning the lithographic blocking layer for removal of a remainder the lithographic stack over the gate structures above the isolation regions;
removing remaining layers of the lithographic stack except the organic planarization layer; and
removing the dielectric layer over the gate structures situated above the isolation regions.

8. The method of claim 1, wherein the dielectric material is recessed to about 10 nm to about 15 nm below top surfaces of the dummy gate structures.

9. The method of claim 1 wherein the spacers are recessed to a height of the recessed dielectric material.

10. The method of claim 1 wherein the hard mask liner layer is formed over the gate electrodes, and filling the depressions over the hard mask liner layer with the filler material further comprises:
over-filling the depressions with the filler material; and
planarizing the filler material to the hard mask liner layer to define the filled depressions.

11. The method of claim 10 further comprising:
removing the hard mask liner layer from over one or more of the dummy gate electrodes; and
removing the one or more of the dummy gate electrodes with an etching process,
wherein the filler material and the hard mask liner layer in the filled depressions protect the dielectric material in the openings during the etching process.

12. The method of claim 11 wherein the one or more of the dummy gate electrodes are arranged over the isolation regions.

* * * * *